US011069553B2

(12) United States Patent
Matyushkin et al.

(10) Patent No.: US 11,069,553 B2
(45) Date of Patent: Jul. 20, 2021

(54) ELECTROSTATIC CHUCK WITH FEATURES FOR PREVENTING ELECTRICAL ARCING AND LIGHT-UP AND IMPROVING PROCESS UNIFORMITY

(71) Applicant: Lam Research Corporation, Fremont, CA (US)

(72) Inventors: Alexander Matyushkin, San Jose, CA (US); John Patrick Holland, San Jose, CA (US); Harmeet Singh, Fremont, CA (US); Alexei Marakhtanov, Albany, CA (US); Keith Gaff, Fremont, CA (US); Zhigang Chen, Campbell, CA (US); Felix Kozakevich, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 620 days.

(21) Appl. No.: 15/634,365

(22) Filed: Jun. 27, 2017

(65) Prior Publication Data
US 2018/0012785 A1  Jan. 11, 2018

Related U.S. Application Data

(60) Provisional application No. 62/359,405, filed on Jul. 7, 2016.

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01); *H01L 21/67109* (2013.01); *H01L 21/6831* (2013.01)

(58) Field of Classification Search
CPC .......... H01L 21/67103; H01L 21/6831; H01L 21/67109; H01L 21/6833
(Continued)

(56) References Cited

U.S. PATENT DOCUMENTS 3,752,956 A * 8/1973 Cahill ................ G05D 23/2401
219/505
4,416,561 A 11/1983 Fischer
(Continued)

FOREIGN PATENT DOCUMENTS

JP    08293539 A    11/1996
JP    2000049143 A   2/2000
(Continued)

OTHER PUBLICATIONS

Notification of Transmittal of International Search Report and the Written Opinion of the International Searching Authority dated Feb. 14, 2018, 15 pages.
(Continued)

*Primary Examiner* — Eric S Stapleton

(57) ABSTRACT

A substrate support for a substrate processing system includes a baseplate, a bond layer provided on the baseplate, and a ceramic layer arranged on the bond layer. The ceramic layer includes a first region and a second region located radially outward of the first region, the first region has a first thickness, the second region has a second thickness, and the first thickness is greater than the second thickness.

16 Claims, 3 Drawing Sheets

(58) Field of Classification Search
USPC .......................................................... 219/385
See application file for complete search history.

(56) References Cited

U.S. PATENT DOCUMENTS

| | | | |
|---|---|---|---|
| 5,059,770 A * | 10/1991 | Mahawili | H01L 21/67103 219/391 |
| 5,074,456 A * | 12/1991 | Degner | H01J 37/32009 156/345.34 |
| 5,376,213 A * | 12/1994 | Ueda | C23C 16/4586 156/345.27 |
| 5,447,570 A | 9/1995 | Schmitz et al. | |
| 5,522,131 A * | 6/1996 | Steger | H01L 21/6831 156/277 |
| 5,583,736 A * | 12/1996 | Anderson | H01L 21/6831 279/128 |
| 5,745,331 A * | 4/1998 | Shamouilian | H01L 21/6831 361/234 |
| 5,753,132 A | 5/1998 | Shamouilian et al. | |
| 5,781,400 A * | 7/1998 | Takahashi | H01L 21/6833 361/233 |
| 5,886,863 A * | 3/1999 | Nagasaki | H01L 21/6831 279/128 |
| 5,928,528 A * | 7/1999 | Kubota | H01J 37/32706 216/67 |
| 5,944,902 A * | 8/1999 | Redeker | H01J 37/321 118/723 AN |
| 5,968,379 A * | 10/1999 | Zhao | C23C 16/45565 118/723 |
| 5,968,587 A * | 10/1999 | Frankel | C23C 16/4404 219/390 |
| 5,978,202 A * | 11/1999 | Wadensweiler | H01L 21/6833 279/128 |
| 6,035,101 A * | 3/2000 | Sajoto | C23C 16/4586 118/728 |
| 6,048,798 A * | 4/2000 | Gadgil | H01J 37/32522 216/67 |
| 6,073,577 A * | 6/2000 | Lilleland | H01J 37/32009 118/723 E |
| 6,108,189 A * | 8/2000 | Weldon | C23C 16/4586 279/128 |
| 6,170,432 B1 * | 1/2001 | Szapucki | C23C 16/455 118/723 E |
| 6,194,322 B1 | 2/2001 | Lilleland et al. | |
| 6,228,438 B1 * | 5/2001 | Schmitt | C23C 16/4583 118/723 E |
| 6,228,439 B1 * | 5/2001 | Watanabe | C23C 14/56 118/719 |
| 6,306,247 B1 * | 10/2001 | Lin | H01J 37/321 118/723 E |
| 6,310,755 B1 * | 10/2001 | Kholodenko | C04B 35/185 361/115 |
| 6,376,385 B2 | 4/2002 | Lilleland et al. | |
| 6,395,363 B1 | 5/2002 | Ballance et al. | |
| 6,452,775 B1 * | 9/2002 | Nakajima | H01L 21/6831 279/128 |
| 6,462,928 B1 * | 10/2002 | Shamouilian | H01L 21/6833 361/234 |
| 6,475,336 B1 * | 11/2002 | Hubacek | C23C 16/4585 118/723 E |
| 6,490,146 B2 * | 12/2002 | Wang | C04B 37/006 361/103 |
| 6,522,519 B1 * | 2/2003 | Hirayanagi | H01L 21/6833 361/233 |
| 6,538,872 B1 * | 3/2003 | Wang | H01L 21/6833 361/103 |
| 6,625,003 B2 * | 9/2003 | Loo | H01L 21/6833 361/233 |
| 6,639,783 B1 * | 10/2003 | Shamouilian | H02N 13/00 279/128 |
| 6,693,790 B2 * | 2/2004 | Matsuki | H01L 21/67017 361/233 |
| 6,721,162 B2 * | 4/2004 | Weldon | C23C 16/4586 279/128 |
| 6,723,202 B2 * | 4/2004 | Nagaiwa | C23C 16/4581 118/715 |
| 6,754,062 B2 * | 6/2004 | Logan | H02N 13/00 361/233 |
| 6,839,217 B1 * | 1/2005 | Larsen | H01L 21/6831 361/233 |
| 6,847,014 B1 * | 1/2005 | Benjamin | H01L 21/67248 219/444.1 |
| 6,922,324 B1 * | 7/2005 | Horwitz | H01L 21/6831 279/128 |
| 6,998,065 B1 * | 2/2006 | Hasegawa | C09K 5/045 252/67 |
| 7,052,553 B1 * | 5/2006 | Shih | B08B 3/12 134/1 |
| 7,196,295 B2 * | 3/2007 | Fennewald | H05B 3/28 219/543 |
| 7,431,788 B2 * | 10/2008 | Ricci | H01L 21/68757 156/153 |
| 8,546,732 B2 * | 10/2013 | Singh | H01L 21/67109 219/486 |
| 8,624,168 B2 * | 1/2014 | Gaff | H01L 21/67109 219/444.1 |
| 8,791,392 B2 * | 7/2014 | Singh | H01L 21/67109 219/446.1 |
| 8,952,297 B2 * | 2/2015 | He | H01L 21/67115 118/728 |
| 9,019,684 B2 * | 4/2015 | Kuribayashi | H01L 21/67109 361/234 |
| 10,340,171 B2 * | 7/2019 | Pape | H01J 37/32082 |
| 2001/0009497 A1 * | 7/2001 | Takahasi | H01L 21/6833 361/234 |
| 2001/0019741 A1 * | 9/2001 | Inaba | C23C 14/564 427/444 |
| 2002/0036881 A1 * | 3/2002 | Shamouilian | C04B 35/185 361/234 |
| 2002/0073922 A1 * | 6/2002 | Frankel | C23C 16/401 118/715 |
| 2002/0075624 A1 * | 6/2002 | Wang | C04B 37/006 361/234 |
| 2002/0129901 A1 * | 9/2002 | Fujikawa | C30B 33/005 156/345.31 |
| 2003/0051665 A1 * | 3/2003 | Zhao | C23C 16/45565 118/723 E |
| 2003/0168439 A1 * | 9/2003 | Kanno | H01L 21/67109 219/390 |
| 2003/0186545 A1 * | 10/2003 | Kamp | H01L 21/31116 438/689 |
| 2003/0211757 A1 * | 11/2003 | Gondhalekar | C23C 16/45563 438/788 |
| 2004/0045813 A1 * | 3/2004 | Kanno | C25D 5/18 204/242 |
| 2004/0060661 A1 * | 4/2004 | Nishimoto | C23C 16/4404 156/345.43 |
| 2004/0134618 A1 | 7/2004 | Endoh et al. | |
| 2004/0231798 A1 * | 11/2004 | Gondhalekar | H01L 21/67017 156/345.33 |
| 2005/0016986 A1 * | 1/2005 | Ito | B32B 18/00 219/444.1 |
| 2005/0079729 A1 * | 4/2005 | Jang | C23C 16/402 438/758 |
| 2005/0145617 A1 * | 7/2005 | McMillin | H05B 3/28 219/543 |
| 2005/0173404 A1 * | 8/2005 | Benjamin | H01L 21/67103 219/444.1 |
| 2005/0211385 A1 * | 9/2005 | Benjamin | H01L 21/67069 156/345.52 |
| 2005/0252903 A1 * | 11/2005 | Maki | H01L 21/67103 219/270 |
| 2006/0002053 A1 * | 1/2006 | Brown | H01L 21/6831 361/234 |
| 2006/0096972 A1 * | 5/2006 | Nakamura | H01L 21/67103 219/444.1 |
| 2006/0273277 A1 * | 12/2006 | Heller | H01J 37/32495 251/334 |

(56) References Cited

U.S. PATENT DOCUMENTS

| | | | |
|---|---|---|---|
| 2007/0000918 A1* | 1/2007 | Steinhauser | A47J 37/0676 219/685 |
| 2007/0076346 A1* | 4/2007 | Dhindsa | H01L 21/6833 361/234 |
| 2007/0098978 A1* | 5/2007 | Tanaka | C09K 3/10 428/336 |
| 2007/0131350 A1* | 6/2007 | Ricci | H01L 21/68757 156/293 |
| 2007/0267145 A1* | 11/2007 | Kitada | H01J 37/32431 156/345.51 |
| 2008/0017632 A1* | 1/2008 | Maki | H01L 21/67103 219/543 |
| 2008/0037194 A1* | 2/2008 | Kamitani | H01L 21/6831 361/234 |
| 2008/0041312 A1* | 2/2008 | Matsuyama | C23C 16/4586 118/728 |
| 2008/0089001 A1* | 4/2008 | Parkhe | H01L 21/6831 361/234 |
| 2009/0034148 A1 | 2/2009 | Lubomirsky et al. | |
| 2009/0159588 A1* | 6/2009 | Morioka | H01L 21/67103 219/444.1 |
| 2009/0174983 A1* | 7/2009 | Dhindsa | H01L 21/6833 361/234 |
| 2009/0235866 A1* | 9/2009 | Kataigi | C23C 16/45521 118/725 |
| 2009/0283976 A1* | 11/2009 | Kaneko | H01L 21/67103 279/128 |
| 2010/0003824 A1 | 1/2010 | Kadkhodayan et al. | |
| 2010/0039747 A1* | 2/2010 | Sansoni | H01L 21/6833 361/234 |
| 2010/0078129 A1* | 4/2010 | Himori | H01L 21/6833 156/345.43 |
| 2010/0109263 A1 | 5/2010 | Jun et al. | |
| 2010/0159712 A1* | 6/2010 | Steger | H01L 21/6831 438/798 |
| 2010/0163188 A1 | 7/2010 | Tanaka et al. | |
| 2010/0163546 A1* | 7/2010 | Nanno | H05B 3/74 219/494 |
| 2010/0244350 A1 | 9/2010 | Fujisato et al. | |
| 2011/0157760 A1 | 6/2011 | Willwerth et al. | |
| 2012/0248715 A1* | 10/2012 | Kondo | H01L 21/6833 279/128 |
| 2013/0001213 A1* | 1/2013 | Lee | H01L 21/67103 219/385 |
| 2013/0027838 A1* | 1/2013 | Hori | H01L 21/6833 361/234 |
| 2013/0114181 A1* | 5/2013 | Drewery | H01L 21/6833 361/234 |
| 2013/0128397 A1* | 5/2013 | Sato | H01J 37/32944 361/54 |
| 2013/0161305 A1* | 6/2013 | Ptasienski | H05B 3/20 219/201 |
| 2013/0228565 A1* | 9/2013 | Kondo | C04B 35/581 219/538 |
| 2013/0229746 A1* | 9/2013 | Aikawa | C04B 35/581 361/234 |
| 2013/0235507 A1* | 9/2013 | Aikawa | C04B 35/581 361/234 |
| 2013/0264015 A1 | 10/2013 | Fang et al. | |
| 2013/0277357 A1* | 10/2013 | Tatsumi | H01L 21/67103 219/443.1 |
| 2013/0340942 A1* | 12/2013 | Schaefer | F16J 15/021 156/345.51 |
| 2014/0063681 A1* | 3/2014 | Anada | H01L 21/68757 361/234 |
| 2014/0096909 A1* | 4/2014 | Singh | C23C 14/541 156/345.52 |
| 2014/0356985 A1* | 12/2014 | Ricci | H01L 21/67109 438/11 |
| 2014/0376148 A1* | 12/2014 | Sasaki | H01L 21/67109 361/234 |
| 2015/0049410 A1* | 2/2015 | Ono | H01L 21/6833 361/234 |
| 2015/0228513 A1* | 8/2015 | Parkhe | H01L 21/67103 219/444.1 |
| 2016/0013026 A1 | 1/2016 | Matsuura et al. | |
| 2016/0135252 A1 | 5/2016 | Matyushkin et al. | |
| 2016/0276198 A1* | 9/2016 | Anada | H01L 21/67109 |
| 2017/0069519 A1 | 3/2017 | Shiraiwa | |
| 2018/0012785 A1* | 1/2018 | Matyushkin | H01L 21/67103 |
| 2018/0240688 A1* | 8/2018 | Hao | H01L 21/67248 |

FOREIGN PATENT DOCUMENTS

| | | |
|---|---|---|
| JP | 2002299425 A | 10/2002 |
| JP | 2009182092 A | 8/2009 |
| JP | 2016-012733 A | 1/2016 |
| KR | 10-0505035 B1 | 7/2005 |
| KR | 10-1413764 B1 | 7/2014 |
| WO | WO-2013039718 A1 | 3/2013 |
| WO | WO-2015009447 A1 | 1/2015 |

OTHER PUBLICATIONS

Notification of Transmittal of International Search Report and the Written Opinion of the International Searching Authority corresponding to International Application No. PCT/US2018/018916 dated May 23, 2018, 12 pages.

Notification of Transmittal of International Search Report and the Written Opinion of the International Searching Authority dated Jun. 20, 2018 corresponding to International Application No. PCT/US2018/021333 , 13 pages.

* cited by examiner

ELECTROSTATIC CHUCK WITH FEATURES FOR PREVENTING ELECTRICAL ARCING AND LIGHT-UP AND IMPROVING PROCESS UNIFORMITY

CROSS-REFERENCE TO RELATED APPLICATIONS

This application claims the benefit of U.S. Provisional Application Ser. No. 62/359,405, filed on Jul. 7, 2016. The entire disclosure of the applications referenced above is incorporated herein by reference.

FIELD

The present disclosure relates to substrate processing systems, and more particularly to systems and methods for protecting sidewalls of a ceramic layer of a substrate support.

BACKGROUND

Substrate processing systems may be used to treat substrates such as semiconductor wafers. Example processes that may be performed on a substrate include, but are not limited to, chemical vapor deposition (CVD), atomic layer deposition (ALD), dielectric etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate and/or sustain chemical and physical interactions with the substrate.

A substrate support such as an ESC may include a ceramic layer arranged to support a substrate. For example, the substrate may be clamped to the ceramic layer during processing. The ceramic layer may be bonded to a baseplate of the substrate support using a bonding layer, which may comprise materials including, but not limited to, silicone with a filler, an epoxy matrix material, etc. The baseplate may comprise a cooled aluminum baseplate.

SUMMARY

A substrate support for a substrate processing system includes a baseplate, a bond layer provided on the baseplate, and a ceramic layer arranged on the bond layer. The ceramic layer includes a first region and a second region located radially outward of the first region, the first region has a first thickness, the second region has a second thickness, and the first thickness is greater than the second thickness.

In other features, the first region corresponds to a center region of the ceramic layer and the second region corresponds to an annular region surrounding the center region. The first thickness is greater than 2 millimeters and the second thickness is less than 2 millimeters. The baseplate includes heat transfer gas supply holes arranged to supply heat transfer gas to an underside of the ceramic layer. The heat transfer gas supply holes are arranged under the second region but not under the first region.

In other features, the ceramic layer includes a third region located between the first region and the second region. The third region corresponds to a transition region having a third thickness that varies between the first region and the second region. The third region is one of stepped, chamfered, and curved.

In other features, the ceramic layer includes a ceramic disk and a ceramic plate arranged on the ceramic disk. The substrate support further includes a second bond layer provided between the ceramic disk and the ceramic plate. The ceramic disk and an inner portion of the ceramic plate correspond to the first region, and the ceramic disk and the inner portion of the ceramic plate define the first thickness. An outer portion of the ceramic plate corresponds to the second region, and wherein the outer portion of the ceramic plate defines the second thickness. The ceramic plate includes a first material and the ceramic disk includes a second material.

A substrate support for a substrate processing system includes a baseplate, a bond layer provided on the baseplate, a ceramic layer arranged on the bond layer, and a dielectric filler layer provided between the baseplate and the ceramic layer. The ceramic layer includes inner portion and an outer portion. The dielectric filler layer and the inner portion of the ceramic layer define a first region. The outer portion of the ceramic layer defines a second region located radially outward of the first region. The first region has a first thickness. The second region has a second thickness. The first thickness is greater than the second thickness.

In other features, the first thickness is greater than 2 millimeters and the second thickness is less than 2 millimeters. The baseplate includes heat transfer gas supply holes arranged to supply heat transfer gas to an underside of the ceramic layer. The heat transfer gas supply holes are arranged under the second region but not under the first region.

In other features, the ceramic layer and the dielectric filler layer define a third region located between the first region and the second region. The third region corresponds to a transition region having a third thickness that varies between the first region and the second region. The third region is one of stepped, chamfered, and curved.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
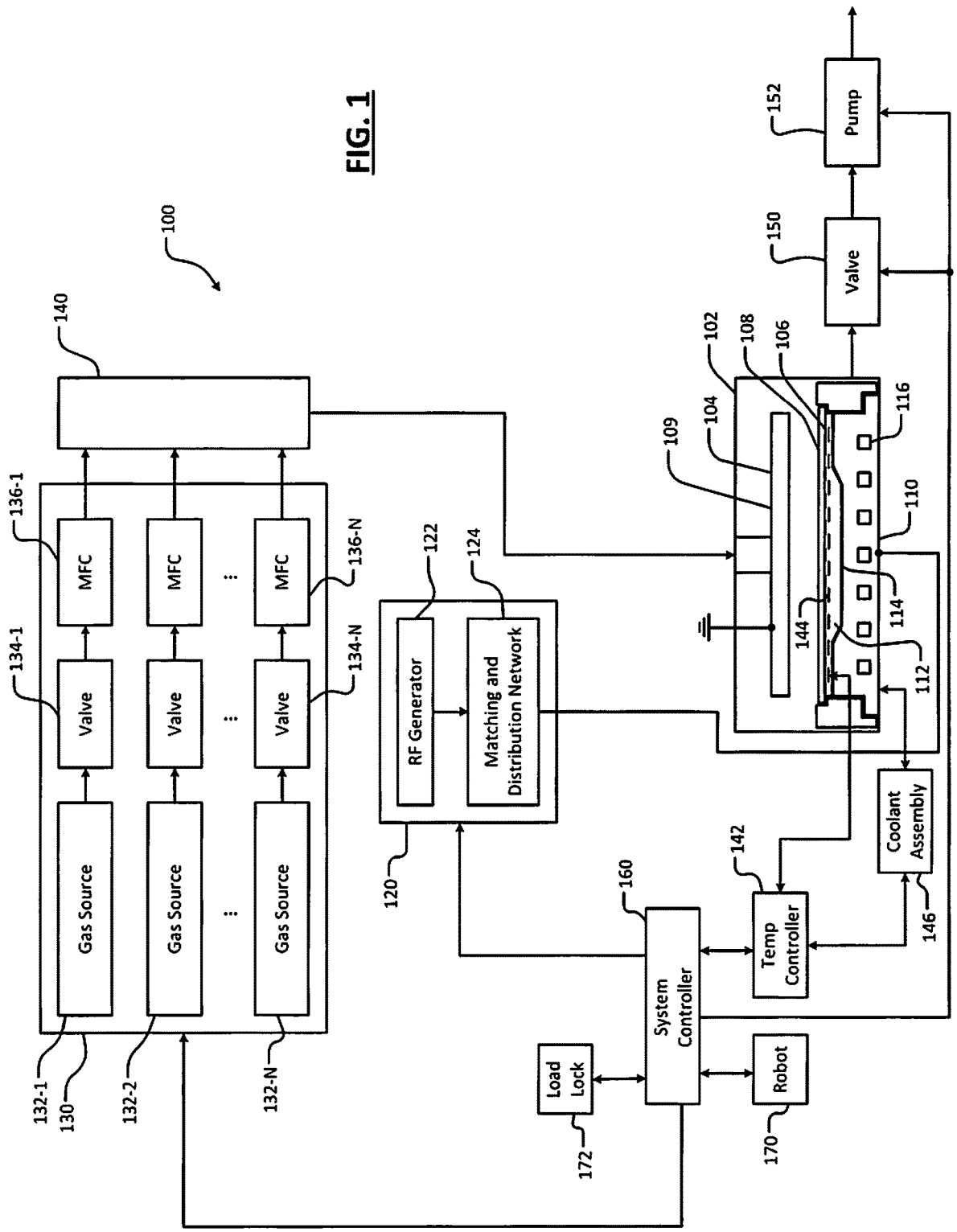
FIG. 1 is a functional block diagram of an example substrate processing system including a substrate support according to the principles of the present disclosure.

A substrate support such as an electrostatic chuck (ESC) in a processing chamber of a substrate processing system may include a ceramic layer bonded to a conductive baseplate. Substrate processing systems may implement plasma processes (e.g., plasma etch processes) requiring high RF power and correspondingly high voltages and currents applied to the ESC and the ceramic layer. For example only, RF voltages applied to the baseplate may range from 1000 V to 8000 V, while RF voltages across the ceramic layer may range from less than 500 V to 3500 V. The plasma etch processes may also require relatively low frequencies (e.g., 2 MHz, or lower). Lower frequencies may cause further increases in RF voltages across the ceramic layer.

The increase in voltage applied across the ceramic layer may cause one or more undesired effects within the substrate processing system. The undesired effects may include, but are not limited to, electrical discharge (i.e., arcing) between a substrate arranged on the ESC and the baseplate and ignition or light-up of a heat transfer gas (e.g., helium, or He) in gas supply holes and/or other cavities of the ESC. Arcing typically causes severe damage to the ESC, the substrate, and/or other components of the substrate processing system and interrupts processing. Similarly, light-up of the heat transfer gas may damage the ESC and/or may cause damage to the substrates that is only detectable at a later processing stage. In some substrate processing systems, a radial gradient of RF flux is greater in a center region of the ESC and/or substrate than in outer regions. Accordingly, etch process radial non-uniformity may occur.

Some of the effects described above may vary with a thickness of the ceramic layer. For example, increasing the thickness of the ceramic layer may improve temperature uniformity and RF flux uniformity while increasing protection of the bond layer between the ceramic layer and the baseplate. However, increasing the thickness of the ceramic layer also increases RF impedance, thereby increasing the possibility of arcing and light-up. These problems associated with increasing the thickness of the ceramic layer may be avoided by eliminating structural voids in the ESC, such as gaps between the ceramic layer and other components of the ESC. In one example, porous ceramic plugs are provided in heat transfer gas supply conduits.

Conversely, decreasing the thickness of the ceramic layer lowers RF impedance and a voltage drop across the ceramic layer, thereby reducing the possibility of arcing and light-up. However, decreasing the thickness of the ceramic layer degrades temperature and RF flux uniformity, while also providing less protection of the bond layer, in lift-pin holes, etc. Accordingly, other mechanisms for improving etch uniformity and protecting the bond layer may be required when the thickness of the ceramic layer is decreased.

Systems and methods according to the principles of the present disclosure implement one or more modifications of the ceramic layer to reduce the possibility of arcing and light-up while still providing temperature and RF flux uniformity and protection of the bond layer. For example, a thickness of a ceramic layer according to the present disclosure varies across a radius of the ceramic layer. In other words, a thickness in a first, center region of the ceramic layer is different from (e.g., greater than) a thickness in a second, outer or edge region (i.e. a second region radially outward of the first region) of the ceramic layer.

In one example, the thickness of the center region of the ceramic layer is greater than or equal to 2 mm (e.g., 5 mm) while the thickness of the outer region of the ceramic layer is less than 2 mm (e.g., between 1 and 1.5 mm). Accordingly, the RF voltage drop across the ceramic layer is reduced in a region of the ceramic layer corresponding to heat transfer gas supply holes to prevent arcing and light-up. The outer region may correspond to an annular region outside of a predetermined diameter of the center region (e.g., 100 mm). Conversely, the center region within the predetermined diameter may not include heat transfer gas supply holes and therefore is not susceptible to arcing and light-up. Accordingly, the center region may have a greater thickness than the outer region to maintain improved temperature and radial RF flux uniformity. The variable thickness (e.g., the respective thicknesses and widths/diameters of the center region and the outer region) of the ceramic layer can be selected according to the structure and process requirements of respective substrate processing systems. In some examples, the material of the ceramic layer may be selected to achieve a desired dielectric constant c to further adjust the RF impedance and tune RF flux uniformity.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers. Other example substrate processing systems include systems that generate plasma in-situ, that implement remote plasma generation and delivery (e.g., using a microwave tube), etc.

For example only, the upper electrode 104 may include a showerhead 109 that introduces and distributes process gases. A base portion is generally cylindrical and extends radially outwardly at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to the lower electrode (e.g., the baseplate 110 of the substrate support 106). The upper electrode 104 may be DC grounded, AC grounded or floating. In some systems, the RF voltage is provided to the upper electrode 104 while the baseplate 110 is grounded. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

The ceramic layer 112 has a variable thickness according to the principles of the present disclosure. For example, a thickness of a center region of the ceramic layer 112 is greater than a thickness of an outer or edge region of the ceramic layer 112 as described below in more detail.

Figure 2:
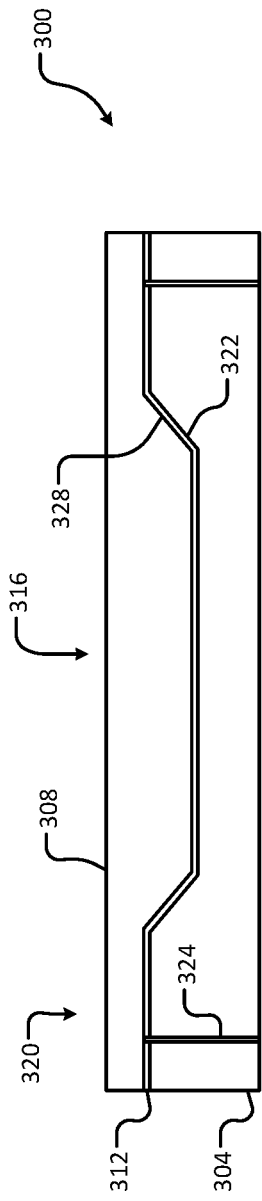
FIG. 2 is a first example substrate support including a variable thickness ceramic layer.

Referring now to FIG. 2, an example substrate support 300 according to the present disclosure includes a baseplate 304 and ceramic layer 308 having a varying thickness across a radius of the substrate support 300. A bond layer 312 is provided between the baseplate 304 and the ceramic layer 308. A thickness of the ceramic layer 308 in a center region 316 is greater than a thickness of the ceramic layer 308 in an outer region 320. For example, the baseplate 304 includes a recessed region 322 configured to conformally accommodate the center region 316. In other words, the recessed region 322 of the baseplate 304 is aligned with and has a complementary profile relative to the center region 316. In one example, a thickness of the bond layer 312 is 0.25 mm, a thickness Z of the center region 316 of the ceramic layer 308 is 4.75 mm, and an overall thickness Y of the center region 316 and the bond layer 312 combined is 5.0 mm. An example thickness of the outer region 320 of the ceramic layer 308 is 1.0 mm. Accordingly, an overall thickness of the outer region 320 and the bond layer 312 combined is 1.25 mm, and an example depth of the recessed region 322 (i.e., a vertical distance from an upper surface of the baseplate 304 to a bottom surface of the recessed region 322) is 3.75 mm. The ceramic layer 308 may comprise, for example only, alumina ($Al_2O_3$), Aluminum nitride (AlN), Yttria ($Y_2O_3$), etc.

An example diameter X of the center region 316 is 110 mm. For example only, the diameter X is selected according to locations of heat transfer gas supply holes 324 provided in the baseplate 304. In other words, the diameter X is selected such that the outer region 320 overlaps the supply holes 324.

A transition region 328 between the outer region 320 and the center region 316 may be stepped, chamfered, etc. As shown, the transition region 328 is chamfered at an angle α (e.g., 45 degrees).

Figure 3:
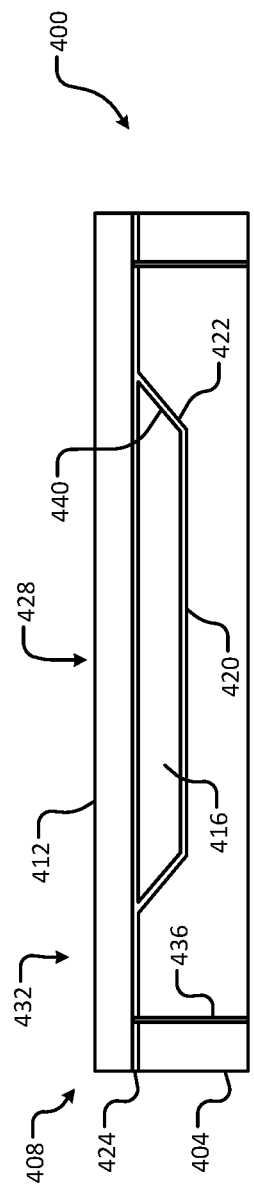
FIG. 3 is a second example substrate support including a variable thickness ceramic layer.

Referring now to FIG. 3, another example substrate support 400 according to the present disclosure includes a baseplate 404 and ceramic layer 408 having a varying thickness across a radius of the substrate support 400. The ceramic layer 408 includes a ceramic plate 412 and a ceramic disk 416. For example, the baseplate 404 includes a recessed region 422 configured to conformally accommodate the ceramic disk 416. In other words, the recessed region 422 of the baseplate 404 is aligned with and has a complementary profile relative to the ceramic disk 416. A first bond layer 420 is provided between a center region of the baseplate 404 and the ceramic disk 416, while a second bond layer 424 is provided between the ceramic plate 412 and the ceramic disk 416 and an outer region of the baseplate 404. A thickness of the ceramic layer 408 in a center region 428 is greater than a thickness of the ceramic layer 408 in an outer region 432. In one example, a thickness of each of the bond layers 420 and 424 is 0.25 mm thick, a thickness Z of the ceramic disk 416 is 3.5 mm, a thickness of the ceramic plate 412 is 1.0 mm, and an overall thickness Y of the center region 428 and the bond layers 420 and 424 combined is 5.0 mm. An overall thickness of the outer region 432 and the bond layer 424 combined is 1.25 mm. The ceramic layer 408 may comprise, for example only, alumina ($Al_2O_3$), Aluminum nitride (AlN), Yttria ($Y_2O_3$), etc., and the ceramic plate 412 and the ceramic disk 416 may comprise the same or different materials.

An example diameter X of the center region 428 is 110 mm. For example only, the diameter X is selected according to locations of heat transfer gas supply holes 436 provided in the baseplate 404. A transition region 440 between the outer region 432 and the center region 428 may be stepped, chamfered, etc. As shown, the transition region 440 is chamfered at an angle α (e.g., 45 degrees).

Figure 4:
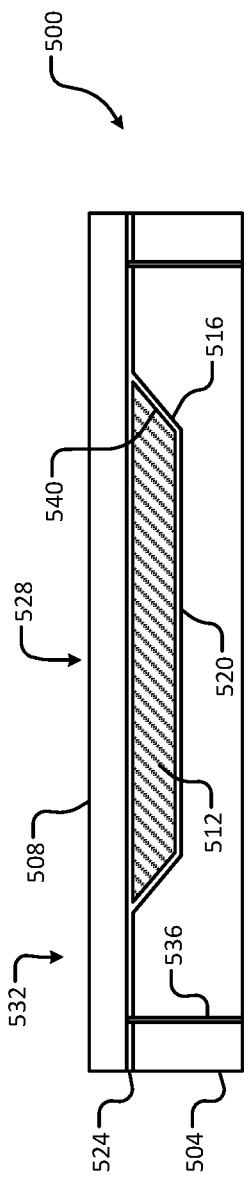
FIG. 4 is a third example substrate support including a ceramic layer and a dielectric layer.

Referring now to FIG. 4, another example substrate support 500 according to the present disclosure includes a baseplate 504, a ceramic layer (e.g., a plate) 508, and a dielectric filler layer 512. The ceramic layer 508 and the dielectric layer 512 have a varying thickness across a radius of the substrate support 500. For example, the baseplate 504 includes a recessed region 516 configured to conformally accommodate the dielectric filler layer 512. In other words, the recessed region 516 of the baseplate 504 is aligned with and has a complementary profile relative to the dielectric filler layer 512. A first bond layer 520 is provided between a center region of the baseplate 504 and the dielectric layer 512, while a second bond layer 524 is provided between the ceramic layer 508 and the dielectric layer 512 and an outer region of the baseplate 504. A thickness of the ceramic layer 508 and the dielectric layer 512 in a center region 528 is greater than a thickness of the ceramic layer 508 in an outer region 532. In one example, a thickness of each of the bond layers 520 and 524 is 0.25 mm thick, a thickness Z of the dielectric layer 512 is 3.5 mm, a thickness of the ceramic layer 508 is 1.0 mm, and an overall thickness Y of the center region 528 and the bond layers 520 and 524 combined is 5.0 mm. An overall thickness of the outer region 532 and the bond layer 524 combined is 1.25 mm. The ceramic layer 508 may comprise, for example only, alumina ($Al_2O_3$), Aluminum nitride (AlN), Yttria ($Y_2O_3$), etc. The dielectric layer 512 may comprise, for example only, the same material as the bond layer 520 or 524, an elastomer material such as Si rubber, plastics or polymer, and/or other electrically non-conductive, thermally conductive composite materials. The dielectric layer 512 may include an alumina or Yttria plasma spray coating.

An example diameter X of the center region 528 is 110 mm. For example only, the diameter X is selected according to locations of heat transfer gas supply holes 536 provided in the baseplate 504. A transition region 540 between the outer region 532 and the center region 528 may be stepped, chamfered, etc. As shown, the transition region 540 is chamfered at an angle α (e.g., 45 degrees).

Figure 5A:
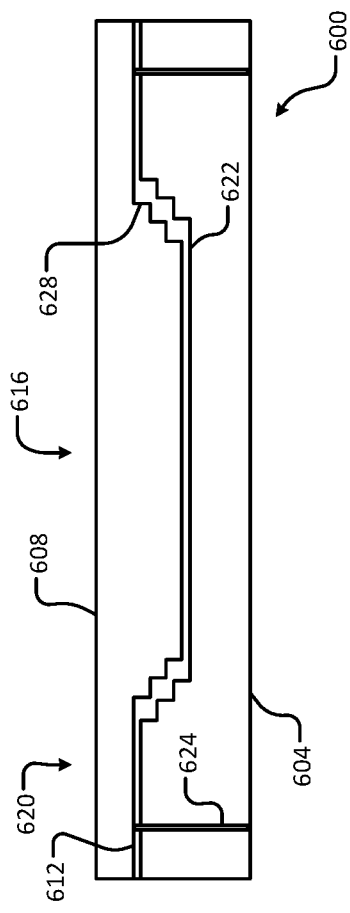
FIG. 5A is a fourth example substrate support including a variable thickness ceramic layer.
Figure 5B:
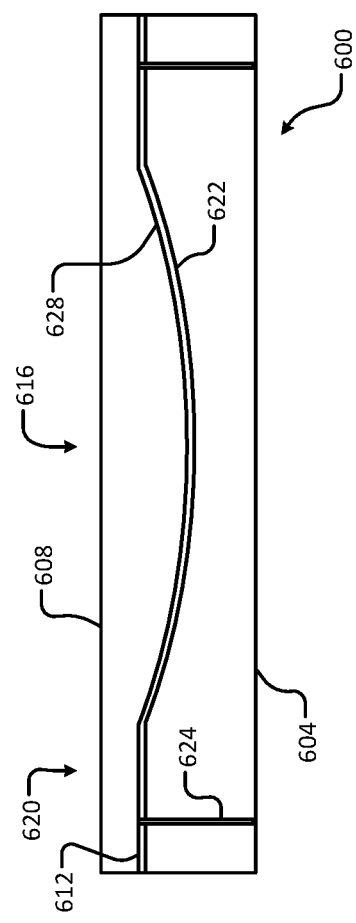
FIG. 5B is a fifth example substrate support including a variable thickness ceramic layer.

Referring now to FIGS. 5A and 5B, example substrate supports 600 according to the present disclosure includes a baseplate 604 and ceramic layer 608 having a varying thickness across a radius of the substrate support 600. A bond layer 612 is provided between the baseplate 604 and the ceramic layer 608. A thickness of the ceramic layer 608 in a center region 616 is greater than a thickness of the ceramic layer 608 in an outer region 620. For example, the baseplate 604 includes a recessed region 622 configured to conformally accommodate the center region 616. In other words, the recessed region 622 of the baseplate 604 is aligned with and has a complementary profile relative to the center region 616. In one example, a thickness of the bond layer 612 is 0.25 mm thick, a thickness Z of the center region 616 of the ceramic layer 608 is 4.75 mm, and an overall thickness Y of the center region 616 and the bond layer 612 combined is 5.0 mm. An example thickness of the outer region 620 of the ceramic layer 608 is 1.0 mm. Accordingly, an overall thickness of the outer region 620 and the bond layer 612 combined is 1.25 mm. The ceramic layer 608 may comprise, for example only, alumina ($Al_2O_3$), Aluminum nitride (AlN), Yttria ($Y_2O_3$), etc.

An example diameter X of the center region 616 is 110 mm. For example only, the diameter X is selected according to locations of heat transfer gas supply holes 624 provided in the baseplate 604. In other words, the diameter X is selected such that the outer region 620 overlaps the supply holes 624.

The substrate supports 600 illustrate other example shapes of the transition region 628 between the outer region 620 and the center region 616. As shown in FIG. 5A, the transition region 628 is stepped. As shown in FIG. 5B, the transition region 628 is curved.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. A substrate support for a substrate processing system, the substrate support comprising:
   a baseplate;
   a bond layer provided on the baseplate; and
   a ceramic layer arranged on the bond layer, wherein
     the ceramic layer includes a first region and a second region located radially outward of the first region,
     the first region has a first thickness,
     the second region has a second thickness such that a lower surface of the ceramic layer steps upward from the first region to the second region, and
     the first thickness is greater than the second thickness,
   wherein the baseplate includes heat transfer gas supply holes arranged to supply heat transfer gas to an underside of the ceramic layer, and wherein the heat transfer gas supply holes are configured for fluid communication with a heat transfer gas source, and
   wherein the heat transfer gas supply holes are arranged directly under an outer edge of the second region but not under the first region.

2. The substrate support of claim 1, wherein the first region corresponds to a center region of the ceramic layer and the second region corresponds to an annular region surrounding the center region.

3. The substrate support of claim 1, wherein the first thickness is greater than 2 millimeters and the second thickness is less than 2 millimeters.

4. The substrate support of claim 1, wherein the ceramic layer includes a third region located between the first region and the second region.

5. The substrate support of claim 4, wherein the third region corresponds to a transition region having a third thickness that varies between the first region and the second region.

6. The substrate support of claim 4, wherein the third region is one of stepped, chamfered, and curved.

7. The substrate support of claim 1, wherein the ceramic layer includes a ceramic disk and a ceramic plate arranged on the ceramic disk.

8. The substrate support of claim 7, further comprising a second bond layer provided between the ceramic disk and the ceramic plate.

9. The substrate support of claim 7, wherein the ceramic disk and an inner portion of the ceramic plate correspond to the first region, and wherein the ceramic disk and the inner portion of the ceramic plate define the first thickness.

10. The substrate support of claim 9, wherein an outer portion of the ceramic plate corresponds to the second region, and wherein the outer portion of the ceramic plate defines the second thickness.

11. The substrate support of claim 7, wherein the ceramic plate comprises a first material and the ceramic disk comprises a second material.

12. A substrate support for a substrate processing system, the substrate support comprising:
   a baseplate;
   a bond layer provided on the baseplate;
   a ceramic layer arranged on the bond layer; and
   a dielectric filler layer provided between the baseplate and the ceramic layer, wherein
     the ceramic layer includes an inner portion and an outer portion,
     the dielectric filler layer and the inner portion of the ceramic layer define a first region,
     the outer portion of the ceramic layer defines a second region located radially outward of the first region,
     the first region has a first thickness,
     the second region has a second thickness such that a lower surface of the ceramic layer steps upward from the first region to the second region, and
     the first thickness is greater than the second thickness,
   wherein the baseplate includes heat transfer gas supply holes arranged to supply heat transfer gas to an underside of the ceramic layer, and wherein the heat transfer gas supply holes are configured for fluid communication with a heat transfer gas source, and wherein the heat transfer gas supply holes are arranged directly under an outer edge of the second region but not under the first region.

13. The substrate support of claim 12, wherein the first thickness is greater than 2 millimeters and the second thickness is less than 2 millimeters.

14. The substrate support of claim 12, wherein the ceramic layer and the dielectric filler layer define a third region located between the first region and the second region.

15. The substrate support of claim 14, wherein the third region corresponds to a transition region having a third thickness that varies between the first region and the second region.

16. The substrate support of claim 14, wherein the third region is one of stepped, chamfered, and curved.

* * * * *